United States Patent [19]

Nagata

[11] 4,227,048
[45] Oct. 7, 1980

[54] AUDIO SIGNAL TRANSMISSION CIRCUIT HAVING A CONSTANT LEVEL TONE-CONTROLLED OUTPUT SIGNAL

[75] Inventor: Yuuichi Nagata, Hamamatsu, Japan

[73] Assignee: Nippon Gakki Seizo Kabushiki Kaisha, Hamamatsu, Japan

[21] Appl. No.: 944,589

[22] Filed: Sep. 21, 1978

[30] Foreign Application Priority Data

Sep. 22, 1977 [JP] Japan .................... 52-128157[U]

[51] Int. Cl.² ............................................. H03G 5/00
[52] U.S. Cl. .................................. 179/1 D; 333/28 T
[58] Field of Search .......... 179/1 D, 1 A, 1 B, 1 VL, 179/100.1 TC; 333/28 T; 330/148, 295; 325/424; 338/131

[56] References Cited

U.S. PATENT DOCUMENTS

| | | | |
|---|---|---|---|
| 2,341,336 | 2/1944 | Singer | 333/28 T |
| 3,732,373 | 5/1973 | Boyden | 179/1 D |
| 4,054,844 | 10/1977 | Oguri | 330/129 |

OTHER PUBLICATIONS

H. P. Walker; "Stereo Mixer"; Wireless World; vol. 77, No. 1428; Jun., 1971; pp. 295-300.

I. Iwamoto; "Multifrequency Responser"; Toshiba Review; Jan.-Feb., 1970; pp. 55-58.

*Primary Examiner*—John H. Wolff
*Assistant Examiner*—Randall P. Myers
*Attorney, Agent, or Firm*—Frishauf, Holtz, Goodman & Woodward

[57] ABSTRACT

An audio signal transmission circuit comprising a first variable attenuator (i.e. volume controller) from which a level-adjusted audio signal is derived, a tone control circuit connected to the output of the first variable attenuator and supplying a tone-controlled audio signal to a loudspeaker, and a second variable attenuator connected between the tone control circuit and a record terminal and feeding the tone-controlled audio signal to the record terminal. The first and second variable attenuators are mechanically interlocked and arranged in such a way that the sum of their attenuating factors remains constant irrespective of any attenuating operation. At the record terminal there can be obtained the tone-controlled audio output signal with a substantially constant level (amplitude level), irrespective of the level adjusting operation of the signal to the loudspeaker.

9 Claims, 7 Drawing Figures

| V21 | R22 | V22C | G24 | V24 | T25 | V28 | R31 | V31C | G33 | V34 |
|---|---|---|---|---|---|---|---|---|---|---|
| -16 dBm | VR MAX 0 | -16 dBm | +20 dB | +4 dBm | -4 dB | 0 | -30 dB | -30 | +14 dB | -16 dBm |
| ↓ | -10 | -26 | ↓ | -6 | ↓ | -10 | -20 | -30 | ↓ | -16 |
| | -20 | -36 | | -16 | | -20 | -10 | -30 | | -16 |
| | -30 | -46 | | -26 | | -30 | 0 | -30 | | -16 |
| ↓ | | | ↓ | | ↓ | | | | ↓ | |

AUDIO SIGNAL TRANSMISSION CIRCUIT HAVING A CONSTANT LEVEL TONE-CONTROLLED OUTPUT SIGNAL

BACKGROUND OF THE INVENTION

This invention relates to an audio signal transmission circuit, and, more particularly, to an audio signal transmission circuit comprising an input terminal, an output terminal, a volume control circuit and a tone control circuit both connected between the input and output terminals, and a record terminal from which is derived a substantially constant level tone-controlled audio signal to be recorded on a recording medium such as a magnetic tape by a suitable recorder.

An example of prior art audio signal transmission circuits provided with a record terminal is shown in FIG. 1. In this circuit, input signals of different levels from signal sources such as a disc record player, an FM tuner and so on are led to an input selecting switch 1, a variable attenuator (i.e. volume controller) 2, a tone control circuit 3, a main amplifier 4 and finally a loudspeaker 5. A record terminal 6 is provided at the output of the tone control circuit 3, and from this terminal a tone-controlled audio signal to be recorded is obtained. However, since the variable attenuator 2 is connected to the input of the tone control circuit 3, the level of a signal obtained at the record terminal 6 will inevitably change if the output level at the loudspeaker 5 is adjusted by means of the variable attenuator 2. It is, however, preferred that the level of a record signal should be changed only at a tape recorder. If the record terminal 6 is connected to the input of the variable attenuator 2 as indicated by a dotted line, the level of a record signal will not change even if the output level of the loudspeaker 5 is adjusted. In this case, however, the tone-controlled audio signal is never obtained at the record terminal 6. If an audio signal is to be recorded on a magnetic tape while being monitored by the loudspeaker, it is desired that the record signal should have the same tone quality as that of audio signal being reproduced by the loudspeaker.

SUMMARY OF THE INVENTION

An object of this invention is to provide an audio signal transmission circuit which comprises a variable attenuator (volume controller) and a tone control circuit which are connected in turn between input and output terminals and in which a tone-controlled audio output signal is derived from a record terminal which has a constant level irrespective of an adjusting operation of the variable attenuator.

An audio signal transmission circuit according to this invention comprises an input terminal for receiving an audio input signal, an output terminal, a record terminal for delivering a signal to be recorded on a magnetic tape, a tone control circuit the output of which is coupled to the output terminal, a first variable attenuating means connected between the input terminal and the input of the tone control circuit for supplying an attenuated audio signal to said tone control circuit, and a second variable attenuating means connected between the output of the tone control circuit and the record terminal for supplying an attenuated output signal of said tone control circuit to the record terminal, the first and second variable attenuating means being interlocked and so designed that the sum of their attenuating factors is substantially constant irrespective of any attenuating operation of the first and second variable attenuating means.

DETAILED DESCRIPTION OF THE PREFERRED EMBODIMENTS

Figure 1:
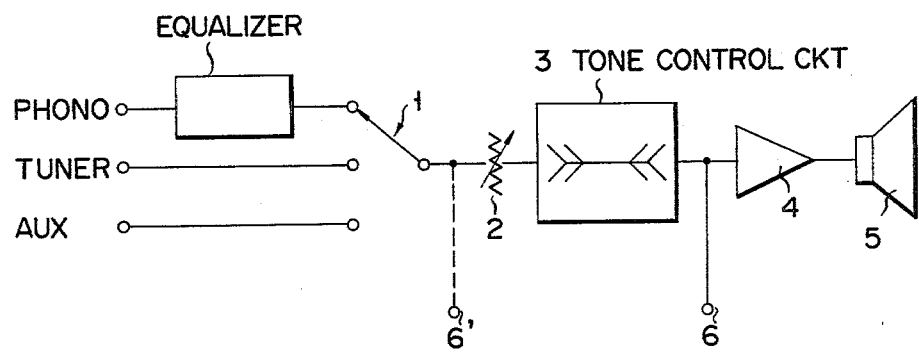
FIG. 1 schematically shows the construction of a prior art audio signal transmission circuit provided with a record terminal.
Figure 2:
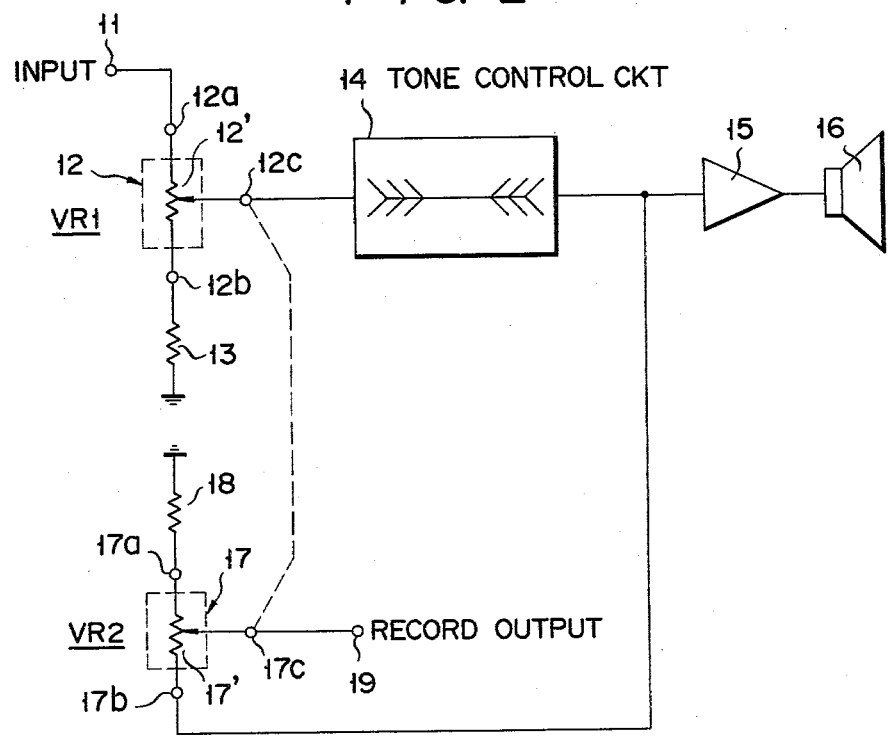
FIG. 2 is a circuit diagram showing the principle of this invention.

With reference to FIG. 2 the basic concept of this invention will be described.

An input signal from a signal source such as a disc record player and an FM tuner is supplied to an input terminal 11. The input signal is supplied via a first variable attenuating means VR1 to a tone control circuit 14, a power amplifier 15 and a loudspeaker 16. An output signal of the tone control circuit 14 is led to a record terminal 19 through a second variable attenuating means VR2. The first variable attenuating means VR1 and the second variable attenuating means VR2 are so designed that the sum of their attenuating factors becomes substantially constant irrespective of any adjusting operation of the variable attenuating means VR1 and VR2.

Namely, the first and second variable attenuating means VR1 and VR2 are so constructed that the attenuating factor of the second variable attenuating means VR2 becomes larger as the attenuating factor of the first variable attenuating means VR1 becomes smaller and vice versa.

More specifically, the first variable attenuating means VR1 comprises a potentiometer 12 and a fixed resistor 13. One fixed terminal 12a of the potentiometer 12 is connected to the input terminal 11, and the other fixed terminal 12b thereof is connected to ground through the resistor 13. Namely, a resistance element 12' between the terminals 12a and 12b of the potentiometer 12 is connected in series with the fixed resistor 13. The slider tap 12c of the potentiometer 12 is connected to an input terminal of the tone control circuit 14. Like the first variable attenuating means VR1, the second variable attenuating means VR2 comprises a potentiometer 17 and a fixed resistor 18. One fixed terminal 17a of the potentiometer 17 is connected to ground through the fixed resistor 18, and the other fixed terminal 17b thereof is connected to an output terminal of the tone control circuit 14. Namely, a resistance element 17' between the terminals 17a and 17b of the potentiometer 17 is connected in series with the fixed resistor 18. The slider tap 17c of the potentiometer 17 is connected to the record terminal 19.

The potentiometers 12 and 17 are mechanically or otherwise suitably interlocked as shown so that, when the slider tap 12c of the potentiometer 12 moves from the terminal 12b to the terminal 12a while kept in contact with the resistance element 12', the slider tap 17c of the potentiometer 17 similarly moves from the terminal 17b to the terminal 17a while kept in contact with the resistance element 17'. As the slider tap 12c moves from the terminal 12a to the terminal 12b, the attenuating factor of the variable attenuating means VR1 becomes greater, and as the slider tap 17c moves from the terminal 17a to the terminal 17b, the attenuating factor of the second variable attenuating means VR2 becomes smaller. It will easily be understood that the sum of the attenuating factors of the variable attenuating means VR1 and VR2 remains always constant, provided that the potentiometers 12 and 17 have the same resistance-variable characteristic and the fixed resistors 13 and 18 have the same resistance value.

In the audio signal transmission circuit of the above-described construction, when an input audio signal is supplied to the input terminal 11, the loudspeaker 16 receives a volume- and tone- controlled audio signal and the record terminal 19 delivers a tone-controlled audio signal.

If an input signal supplied to the input terminal 11 has a level V11 (dBm), the first variable attenuator VR1 has an attenuating factor R12 (dB), the tone control circuit 14 has an attenuating factor T14 (dB), the second variable attenuator VR2 has an attenuating factor R17 (dB), and a signal obtained at the record terminal 19 has a level V19 (dBm), then V19 is expressed as follows:

$$V19 = V11 + R12 + T14 + R17 \text{ (dB)} \ldots \quad (1)$$

Here, the sum of the attenuating factors of the variable attenuating means VR1 and VR2 is constant: $R12 + R17 = R$ (constant) (dB). Further, T14 is also constant.

Thus, equation (1) can be rewritten as follows:

$$V19 = V11 + R + T14 \text{ (dB)} \ldots \quad (2)$$

As equation (2) shows, even if the first variable attenuating means VR1 changes the level (i.e. volume) of an output signal to the loudspeaker 16, the level of a signal obtained at the record terminal 19 is not affected by the volume adjustment and thus remains constant. It is therefore possible to change the volume of the loudspeaker 17 freely even when the audio signal is recorded. Moreover, if an amplifier having a gain G (dB) [$G = -(R + T14)$] is connected the output of the second variable attenuating means VR2, a signal having the same level as that of the input signal supplied to the input terminal 11 can be derived from the record terminal 19.

Figure 3:
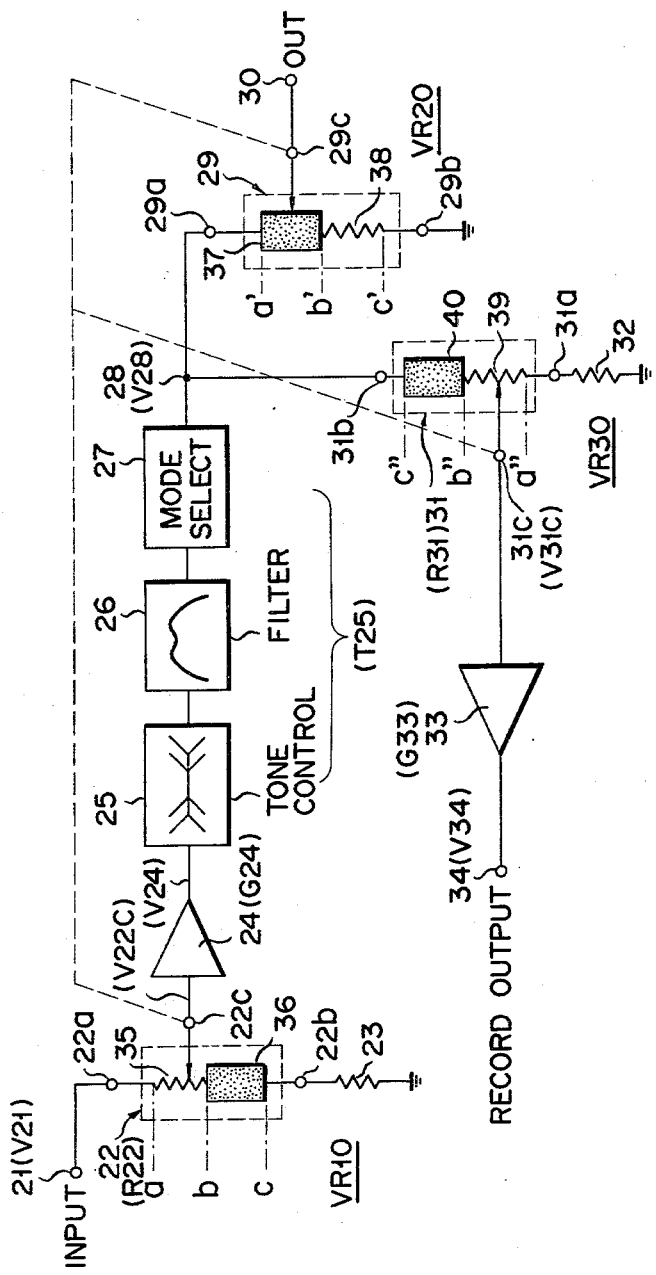
FIG. 3 is a circuit diagram of the audio signal transmission circuit embodying this invention.

With reference to FIG. 3 a practical arrangement of this invention will be described, in which an input terminal 21 is connected to one fixed terminal 22a of a potentiometer 22, and the other fixed terminal 22b of the potentiometer 22 is connected to ground through a fixed resistor 23 having a resistance of r23. The potentiometer 22 and the fixed resistor 23 constitutes a first variable attenuating means VR10.

To the slider tap 22c of the potentiometer 22 an amplifier 24, a tone control circuit 25, a filter circuit 26 and a mode selector 27 are connected in turn. The output terminal 28 of the mode selector 27, which is used in a stereophonic transmission system, is connected to one fixed terminal 29a of another potentiometer 29. The other fixed terminal 29b of the potentiometer 29 is connected to ground. The slider tap 29c of the potentiometer 29 is connected to an output terminal 30, which is connected to a main amplifier (not shown). The potentiometer 29 alone constitutes a second variable attenuating means VR20.

The output terminal 28 of the mode selector 27 is connected also to one fixed terminal 31b of a potentiometer 31. The other fixed terminal 31a of the potentiometer 31 is connected to ground through a resistor 32 having a resistance of r32. The slider tap 31c of the potentiometer 31 is connected to a record terminal 34 through an amplifier 33. The potentiometer 31 and the resistor 33 constitutes a third variable attenuating means VR30.

The potentiometers 22, 29 and 31 are so designed to mechanically or otherwise suitably interlock with one another. For example, when the slider tap 22c of the potentiometer 22 is moved from the terminal 22b to the terminal 22a, the slider tap 29c of the potentiometer 29 moves from the terminal 29b to the terminal 29a and, at the same time, the slider tap 31c of the potentiometer 31 moves from the terminal 31b to the terminal 31a.

The potentiometer 22 is constituted by a resistor element 35 (resistance r35) and a conductor element 36 connected in series with each other. The conductor element 36 is connected between the resistor element 35 and the terminal 22b. Similarly, the potentiometer 29 is constituted by a conductor element 37 and a resistor element 38 (resistance r38) connected in series with each other. The conductor element 37 is connected between the terminal 29a and the resistor element 38. The potentiometer 31 is constituted by a resistor element 39 (resistance r39) and a conductor element 40. The conductor element 40 is connected between the terminal 31b and the resistor element 39.

More specifically, the potentiometers 22, 29 and 31 are so constituted that their slider taps are positioned in the following manner. When the slider tap 22c of the potentiometer 22 is in contact with one end c of the conductor element 36, which is near the terminal 22b, the slider tap 29c of the potentiometer 29 and the slider tap 31c of the potentiometer 31 are put in contact respectively with one end c' of the resistor element 38, which is near the terminal 29b, and with one end c'' of the conductor element 40, which is near the terminal 31b. When the slider tap 22c is in contact with the other end b of the conductor element 36, the slider taps 29c and 31c are put in contact respectively with the other end b' of the resistor element 38 and with the other end b'' of the conductor element 40. When the slider tap 22c is in contact with one end a of the resistor element 35, which is near the terminal 22a, the slider taps 29c and 31c are put in contact respectively with one end a' of the conductor element 37, which is near the terminal 29a, and with one end a'' of the resistor element 39, which is near the terminal 31a.

The variable attenuating means VR 20 connected to the main amplifier (not shown) cooperates with the variable attenuating means VR10 connected to the input terminal 21. With the construction of variable attenuating means VR10 and VR20 of FIG. 3, the gain-variable range of the amplifying system from the input terminal 21 to the output terminal 30 includes two sub-ranges. The variable attenuating means VR30 is provided so that the sum of its attenuating factor and that of the variable attenuating means VR10 remains constant irrespective of adjusting operation of the variable attenuating means. The condition to achieve this object is that the potentiometers 22 and 31 have the same resistance-variable characteristic, and $(r23/r35+r23)=(r32/r32+r39)$.

Figure 4:
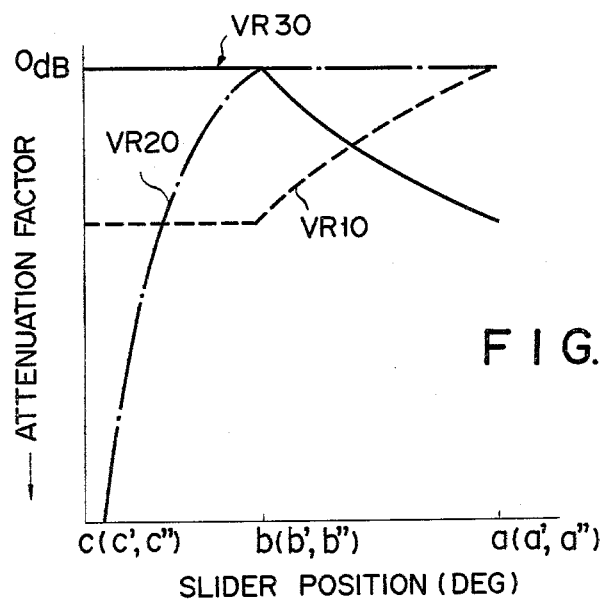
FIG. 4 shows the relationship between the attenuating factors of the variable attenuators shown in FIG. 3 and the positions of the slider taps of the variable attenuations.

FIG. 4 shows the attenuation characteristics of the variable attenuating means VR10, VR20 and VR30 with respect to the positions (angles of rotation) of the slider taps 22c, 29c and 31c.

If an input signal supplied to the input terminal 21 has a level V21 (dBm), the variable attenuating means VR10 has an attenuating factor R22 (dB), the amplifier 24 has a gain G24 (dB), the tone control circuit 25, the filter circuit 26 and the mode selector 27 have a total attenuating factor T25 (dB), a signal obtained at the output terminal 28 has a level V28 (dBm), the variable attenuating means VR30 has an attenuating factor R31 (dB), the amplifier 33 has a gain G33 (dB), and a signal obtained at the record terminal 34 has a level V34 (dBm), then the levels V28 and V34 are expressed as follows:

$$V28 = V21 + R22 + G24 + T25 \text{ (dB)} \quad (3)$$

$$V34 = V28 + R31 + G33 \text{ (dB)} \quad (4)$$

If V34 is to be equal to V21, the following equation has to be established:

$$R22 + G24 + T25 + R31 + G33 = 0 \quad (5)$$

Here, G24, T25 and G33 would never change, once they have been set. Further, the sum of R22 and R31 is constant. Thus, if R22, G24, T25, R31 and G33 are selected to have such values as would satisfy equation (5), V34 remains equal to V21, regardless of the angles of rotation of the slider taps of the potentiometers 22 and 31.

Figure 5:
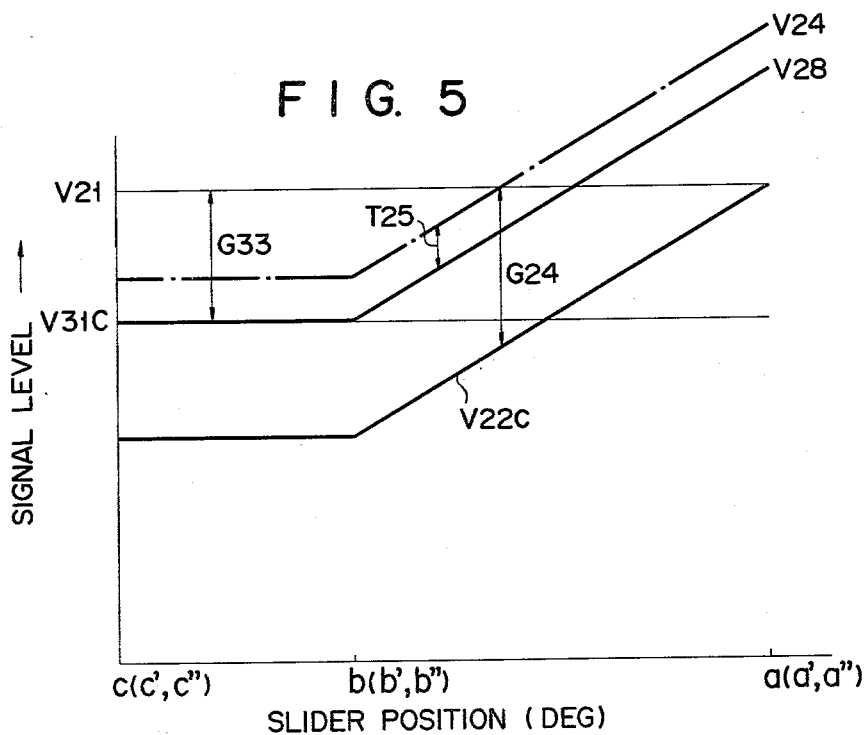
FIG. 5 shows the relationship between the positions of the slider taps of the variable attenuators shown in FIG. 3 and the levels of signals at the various parts of the circuit shown in FIG. 3.
Figures 6, 7:
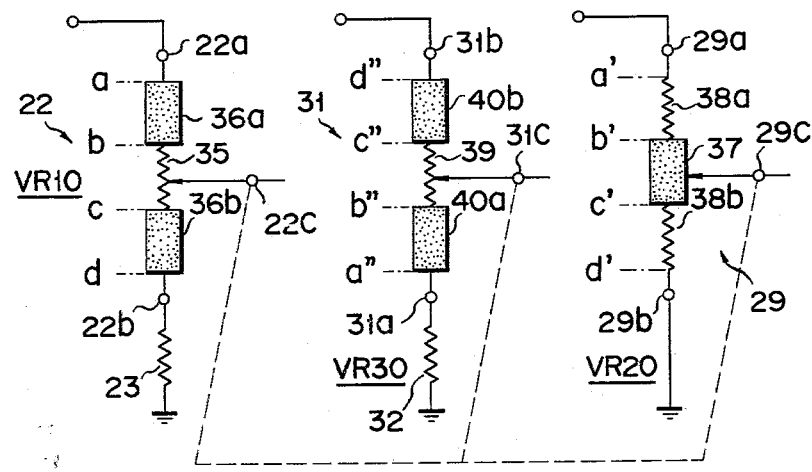
FIG. 6 is a table of practical numerical data clarifying the relationship of FIG. 5.
FIG. 7 shows a modification of the variable attenuators used in the embodiment shown in FIG. 3.

FIG. 5 illustrates the relationship between the angles of rotation of the slider taps of the potentiometers 22 and 31 and the levels of signals at the various parts of the circuit shown in FIG. 3. FIG. 6 gives numerical data more concretely showing this relationship. In FIGS. 5 and 6, V22c denotes the level of a signal at the slider tap 22c of the potentiometer 22, V24 the level of a signal at the output of the amplifier 24, and V31c the level of a signal at the slider tap 31c of the potentiometer 31.

In the audio signal transmission circuit shown in FIG. 3, the amplifier 33 is connected to the output of the potentiometer 31. The amplifier 33 may be omitted in order to reduce the cost of the audio signal transmission circuit. If the amplifier 33 is omitted, the level V34 of a signal obtained at the record terminal 34 is expressed as follows:

$$V34 = V21 + R22 + G24 + T25 + R31 \text{ (dB)}.$$

The over-all gain of the transmission system extending from the input terminal 21 to the output terminal 30 is controlled by the variable attenuating means VR10 and VR20. The gain variable range is divided into two sub-ranges. When the input terminal 21 receives an input signal of a low level, the over-all gain is adjusted solely by the variable attenuating means VR10 because the slider tap 22c comes into contact with the resistor element 35 and the slider tap 29c of the variable attenuating means VR20 comes into contact with the conductor element 37.

When the input terminal 21 receives an input signal of a high level, the over-all gain of the transmission system is adjusted solely by the variable attenuating means VR20. This is because the potentiometer 22 has its slider tap 22c put in contact with the conductor element 36 and the potentiometer 29 has its slider tap 29c put in contact with the resistor element 38. In other words, an input signal of a high level is attenuated by a maximum attenuating factor (r23/r23+r35) of the variable attenuating means VR10 and then supplied to the amplifier 24. Unless the maximum attenuating factor of the variable attenuating means VR10 is of such value as to give an output signal of the attenuating means VR10 of such a level as would saturate the amplifier 24, an input signal can be amplified without any distortion resulting from saturation of the amplifier 24.

To prominently improve the S/N ratio of an output signal of the amplifying system, the gain-variable range of the system may be divided into three sub-ranges, i.e. near-minimum range, middle range and near-maximum range, as described in U.S. Pat. No. 4,054,844 issued to Kenro Oguri and assigned to the same assignee as this application. In this case, the variable attenuating means VR10, and VR20 are constructed as shown in FIG. 7. Namely, the potentiometer 22 of the variable attenuating means VR10 is constituted by a conductor element 36a, a resistor element 35 and a conductor element 36b which are connected in series between the terminals 22a and 22b. On the other hand, the potentiometer 29 of the variable attenuating means VR20 is constituted by a resistor element 38a, a conductor element 37 and a resistor element 38b which are connected in series between the terminals 29a and 29b. The potentiometer 31 of the variable attenuating means VR30 is constituted, as in the potentiometer 22, by a conductor element 40a, a resistor element 39 and a conductor element 40b which are connected in series between the terminals 31a and 31b.

The potentiometers 22, 29 and 31 illustrated in FIG. 7 are so constructed that their slider taps 22c, 29c and 31c move in the following manner. When the slider tap 22c of the potentiometer 22 moves from the terminal 22a to the terminal 22b, the slider tap 29c of the potentiometer 29 moves from the terminal 29a to the terminal 29b and the slider tap 31c of the potentiometer 31 moves from the terminal 31a to the terminal 31b. The terminals a, b, c and d of the serial connection of the potentiometer 22 correspond to the terminals a', b', c' and d' of the potentiometer 29, respectively and to the terminals a", b", c" and d" of the potentiometer 31, respectively. Thus, when the slider tap 22c of the potentiometer 22 is in contact with, for example, the terminal b, the slider taps 29c and 31c are put in contact with the terminals b' and b", respectively.

When an input signal of a low level is supplied to the input terminal 21, the potentiometers 22 and 29 are gang-operated so that their slider taps 22c and 29c are brought into contact with the conductor element 36a and the resistor element 38a, respectively. Namely, in this case the over-all gain of the transmission system is adjusted solely by the variable attenuating means VR20. Since the attenuation of the signal is carried out on the output side of the amplifier 24 (FIG. 3) when the input signal is of a low level, the noise inherent to the amplifier are also attenuated so that the S/N ratio of the output signal is markedly improved. When an input signal of a middle level is supplied to the input terminal 21, the slider taps 22c and 29c are brought into contact with the resistor element 35 and the conductor element 37, respectively. In this case, the over-all gain is adjusted solely by the variable attenuating means VR10, and the attenuating factor of the variable attenuator VR20 remains constant. When an input signal of a high level is supplied to the input terminal 21, the slider taps 22c and 29c of the potentiometers 22 and 29 are adjusted to come into contact with the conductor element 36b and the resistor element 38b, respectively. In this case the over-all gain of the transmission system is adjusted solely by the variable attenuating means VR20. The attenuating factor of the variable attenuating means VR10 for an input signal of a relatively high level remains at the maximum value, whereby the amplifier 24 is prevented from being saturated. It is needless to say that the attenuating means VR10 and VR30 are so arranged that the sum of the their attenuating factors is constant irrespective of any adjusting operation of the attenuating means VR10 and VR30 also in the arrangement shown in FIG. 7.

What is claimed is:

1. An audio signal transmission circuit comprising:
   an input terminal for receiving an audio input signal;
   a first output terminal for delivering a first output signal;
   a second output terminal for delivering a second output signal;
   a tone control circuit having an output which is coupled to said first output terminal, said tone control circuit supplying a tone controlled signal at its output;
   first variable attenuating means connected between said input terminal and the input of said tone control circuit, the output of said first variable attenuating means having a variable signal level; and
   second variable attenuating means connected between the output of said tone control circuit and said second output terminal for supplying a tone controlled output signal of said tone control circuit to said second output terminal, said first and second attenuating means being interlocked and so designed that the sum of their attenuating factors is substantially constant irrespective of any attenuating operation of said first and second variable attenuating means so that the tone controlled signal at said second output terminal has a substantially constant level.

2. An audio signal transmission circuit according to claim 1, wherein said first variable attenuating means comprises a first potentiometer having a first fixed terminal connected to said input terminal, a second fixed terminal connected to ground through a resistor and a first slider terminal connected to the input of said tone control circuit, and said second variable attenuating means comprises a second potentiometer interlocked with said first potentiometer and having a third fixed terminal connected to ground through a resistor, a fourth fixed terminal connected to the output of said tone control circuit and a second slider terminal connected to said second output terminal.

3. An audio signal transmission circuit according to claim 2, further comprising a first amplifier connected between the first slider terminal of said first potentiometer and the input of said tone control circuit.

4. An audio signal transmission circuit according to claim 2 or 3, further comprising a second amplifier connected between the second slider terminal of said second potentiometer and said second output terminal.

5. An audio signal transmission circuit according to claim 2, wherein said first potentiometer includes a first resistor element and a first conductor element which are connected in series between the first and second fixed terminals, said first resistor element having one end connected to said first fixed terminal and another end connected to said second fixed terminal through said first conductor element; and said second potentiometer includes a second resistor element and a second conductor element connected in series between said third and fourth fixed terminals, said second resistor element having one end connected to said third fixed terminal and the other end connected to said fourth fixed terminal through said second conductor element.

6. An audio signal transmission circuit according to claim 2, further comprising a third variable attenuating means which includes a third potentiometer which is interlocked with said first and second potentiometers and which has a fifth fixed terminal connected to the output of said tone control circuit, a sixth fixed terminal connected to ground and a third slider terminal connected to said first output terminal.

7. An audio signal transmission circuit according to claim 6, wherein said third potentiometer includes a third resistor element and a third conductor element which are connected in series between said fifth and sixth fixed terminals, said third resistor element having one end connected to said fifth fixed terminal through said third conductor element and another end connected to said sixth fixed terminal.

8. An audio signal transmission circuit according to claim 2, wherein said first potentiometer includes a first element, a first resistor element and a second conductor element which are connected in series between said first and second fixed terminals, said first resistor element being arranged between said first and second conductor element; and said second potentiometer includes a third conductor element, a second resistor element and a fourth conductor element which are connected in series between said third and fourth fixed terminals, said second resistor element being arranged between said third and fourth conductor elements.

9. An audio signal transmission circuit according to claim 8, further comprising third attenuating means which includes a third potentiometer which is interlocked with said first and second potentiometers and which has a fifth fixed terminal connected to the output of said tone control circuit, a sixth fixed terminal connected to ground and a third slider terminal connected to said first output terminal, said third potentiometer including a third resistor element, a fifth conductor element and a fourth resistor element which are connected in series between said fifth and sixth fixed terminals, said fifth conductor element being arranged between said third and fourth resistor elements.

* * * * *